United States Patent [19]

Laderman et al.

[11] Patent Number: 5,084,411
[45] Date of Patent: Jan. 28, 1992

[54] SEMICONDUCTOR PROCESSING WITH SILICON CAP OVER $SI_{1-x}GE_x$ FILM

[75] Inventors: Stephen Laderman, Menlo Park; Martin Scott, San Francisco; Theodore I. Kamins, Palo Alto; Judy L. Hoyt, Palo Alto; Clifford A. King, Palo Alto; James F. Gibbons, Palo Alto; David B. Noble, Sunnyvale, all of Calif.

[73] Assignee: Hewlett-Packard Company, Palo Alto, Calif.

[21] Appl. No.: 277,593

[22] Filed: Nov. 29, 1988

[51] Int. Cl.⁵ .............................................. H01L 21/20
[52] U.S. Cl. .................................... 437/131; 437/126; 148/DIG. 15
[58] Field of Search ...................... 437/126, 131, 132; 148/DIG. 15

[56] References Cited

U.S. PATENT DOCUMENTS

| 4,392,297 | 7/1983 | Little | 437/131 |
| 4,529,455 | 7/1985 | Bean et al. | 437/946 |
| 4,771,013 | 9/1988 | Curran | 437/131 |
| 4,843,028 | 6/1989 | Herzog et al. | 437/131 |
| 4,859,626 | 8/1989 | Wise | 148/DIG. 15 |
| 4,861,393 | 8/1989 | Bean et al. | 437/131 |
| 4,879,256 | 11/1989 | Bean et al. | 437/131 |

FOREIGN PATENT DOCUMENTS

| 0105832 | 5/1986 | Japan | 437/132 |
| 0014418 | 1/1988 | Japan | 437/132 |

Primary Examiner—Olik Chaudhuri
Assistant Examiner—M. Wilczewski

[57] ABSTRACT

Improved devices with silicon to SiGe alloy heterojunctions are provided for in accordance with the following discoveries. X-ray topography and transmission electron microscopy were used to quantify misfit-dislocation spacings in as-grown $Si_{1-x}Ge_x$ films formed by Limited Reaction Processing (LRP), which is a chemical vapor deposition technique. These analysis techniques were also used to study dislocation formation during annealing of material grown by both LRP and by molecular beam epitaxy (MBE). The thickness at which misfit dislocations first appear in as-grown material was similar for both growth techniques. The thermal stability of capped and uncapped films was also investigated after rapid thermal annealing in the range of 625° to 1000° C. Significantly fewer misfit dislocations were observed in samples containing an epitaxial silicon cap. Some differences in the number of misfit dislocations generated in CVD and MBE films were observed after annealing uncapped layers at temperatures between 625° and 825° C.

3 Claims, 5 Drawing Sheets

Figure I

SEMICONDUCTOR PROCESSING WITH SILICON CAP OVER $Si_{1-x}Ge_x$ FILM

BACKGROUND OF THE INVENTION

The present invention relates to semiconductor processing and, more specifically, to a method of forming semiconductor structures including heterojunctions. A major objective of the present invention is to provide for the fabrication of $Si_{1-x}Ge_x$ on Si heterojunctions with minimal misfit dislocations despite exposure of the already annealed $Si_{1-x}Ge_x$ to high processing temperatures.

The recent fabrication of near-ideal heterojunction bipolar transistors has increased the need to understand the structural stability of $Si_{1-x}Ge_x$ alloy thin films grown on silicon. (See 1. C. A. King, J. L. Hoyt, C. M. Gronet, J. F. Gibbons, M. P. Scott and J. Turner, accepted for publication in IEEE Electron Device Letters.) It is important to prevent strain relaxation in these pseudomorphic device structures to preserve the desired band gap and avoid recombination currents associated with closely spaced misfit dislocations. (See C. A. King, J. L. Hoyt, D. B. Noble, C. M. Gronet, J. F. Gibbons, M. P. Scott, T. I. Kamins, and S. S. Laderman, submitted to IEEE Electron Device Letters.)

Measurements to date of the generation of misfit dislocations during growth of $Si_{1-x}Ge_x$ have focused on epitaxial layers grown by Molecular Beam Epitaxy (MBE). (See J. C. Bean, L. C. Feldman, A. T. Fiory, S. Nakahara, and I. K. Robinson, J. Vac. Sci. Technol.A, 2, 436 (1984); see also E. Kasper and H. J. Herzog, Thin Solid Films 44, 357 (1977)).

Some of these studies have used Rutherford backscattering (RBS) and x-ray diffraction to characterize the onset of strain relaxation. The sensitivity of these techniques is not sufficient to study the early stages of misfit dislocation generation. A combination of techniques has been used to characterize individual dislocations in as-grown MBE samples (See E. P. Kvam, D. J. Eaglesham, D. M. Maher, C. J. Humphreys, J. C. Bean, G. S. Green, and B. K. Tanner, Materials Research Society Symposium Proceedings Volume 104, 623 (1988); see also Y. Kohama, Y. Fukuda, and M. Seki, Appl. Phys. Lett. 52, 380 (1988)). However, little experimental data has been presented concerning the onset of dislocation generation induced by post-growth annealing and no comparison has been made between $Si_{1-x}Ge_x$ formed by MBE and that formed by chemical vapor deposition.

Results are presented below on material grown by limited reaction processing (LRP), a CVD technique that relies on the rapid heating and cooling of the substrate to initiate and terminate growth. (See J. F. Gibbons, C. M. Gronet, and K. E. Williams, Appl. Phys. Lett. 47, 721 (1985)). These $Si_{1-x}Ge_x$ films have been found to contain approximately $10^{20}$ oxygen atoms/cm$^3$. The reports by Kasper and by Kvam, cited above, have shown that as-grown, MBE $Si_{1-x}Ge_x$ films are metastable with dislocation spacings larger than predicted by equilibrium theory.

SUMMARY OF THE INVENTION

In accordance with the present invention, layers are deposited over a SiGe alloy thin film layer using process steps exceeding 600° C. This is made practical by capping the alloy layer with a silicon layer which serves to minimize dislocation spacings. The degree to which the silicon cap prevents dislocation spacings is much greater than expected in view of the prior art. As a result, a substantially broader range of process steps are now practical after the deposition of an alloy layer. One significant advantage is the ability to manufacture heterojunction devices which have greater performance and reliability because a greater range of processes can be used without inducing dislocation spacings.

The thermal stability of both uncapped and epitaxial-silicon capped structures are characterized below by x-ray topography and transmission electron microscopy. The observed stability was compared to the stability of the film predicted by equilibrium theory.

DESCRIPTION OF THE PREFERRED EMBODIMENTS

Figure 1:
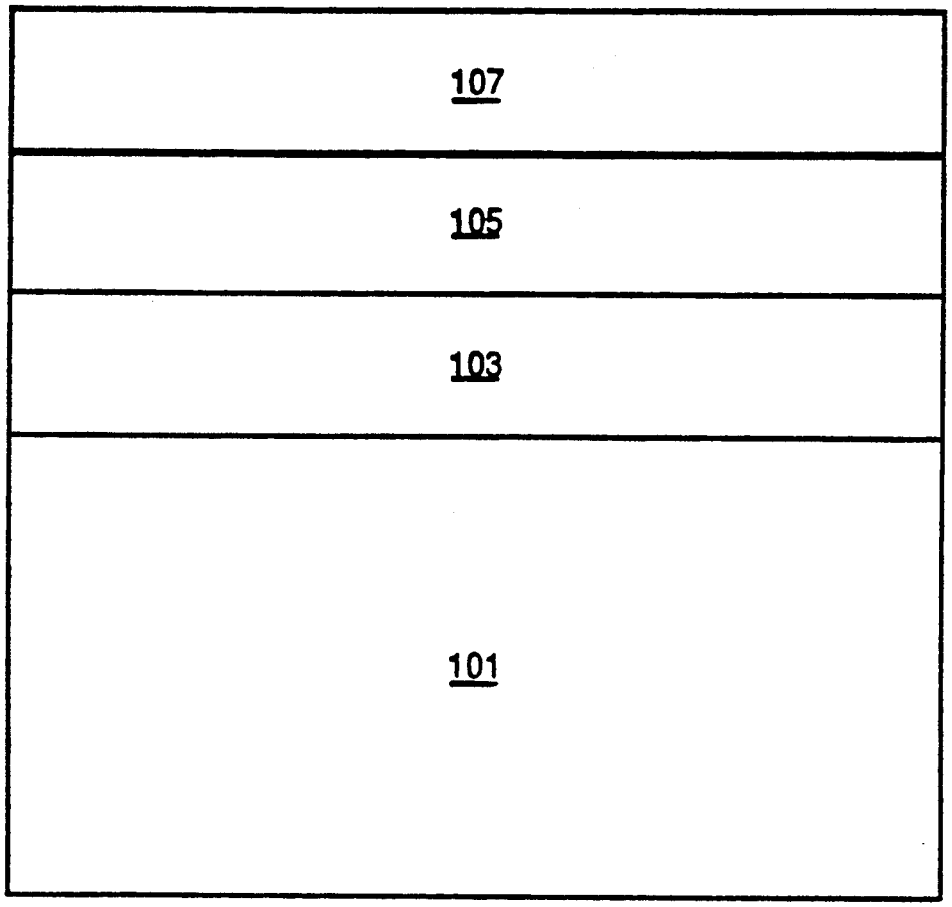
FIG. 1 is a schematic elevation view of a structure fabricated in accordance with the present invention.
Figure 2:
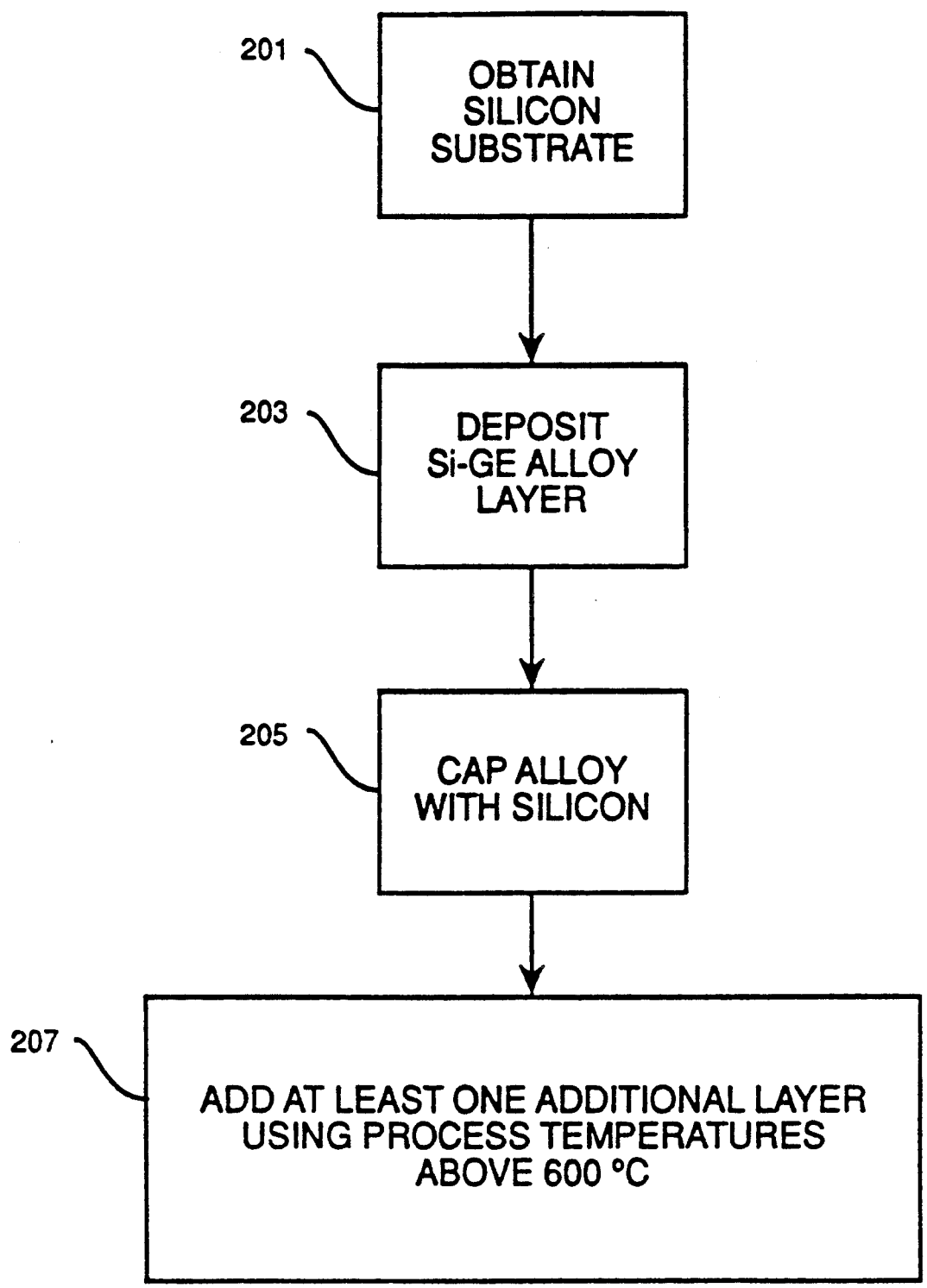
FIG. 2 is a flow chart of a the method used to fabricate the structure of FIG. 1.

A heterojunction structure 100, is shown in FIG. 1, comprises a silicon substrate 101, a SiGe alloy layer 103, a silicon cap 105, and an upper layer 107. Structure 100 is formed according to the steps shown in FIG. 2. Silicon substrate 101 is obtained, as indicated at 201. Silicon substrate can include multiple subelements, such as multiple collectors defining distinct circuit devices, such as transistors. SiGe alloy layer 103 is deposited on substrate 100, as indicated at 203. Silicon cap 105 is applied as indicated at 205. Subsequently, layer 107 is applied as indicated at 207. Layer 107 can include one or more sublayers. In particular, layer 107 can include a metallization which requires high temperature processing to define different devices. Optimal patterning requires temperatures exceeding 600° C. This optimal processing proceeds without damaging alloy layer 103 due to the effect of silicon cap 105.

The epitaxial layers grown by LRP had a germanium mole fraction $x=0.21$ as measured by Rutherford backscattering (RBS). These films were grown at 625° C. using $GeH_4$ and $SiH_2Cl_2$ in an apparatus that has been described by Matthews et al., cited above. Thicknesses were found by RBS to be 50 to 200 nm. The capped samples were prepared by growing approximately 200 nm of silicon at 840° C. at a steady-state growth rate of 0.8 nm/sec on top of the $Si_{0.79}Ge_{0.21}$ layers. Epitaxial structures were also grown by MBE with a measured Ge mole fraction $x=0.15$ at a growth temperature of 520° C. Both sets of films were grown on (001)-oriented silicon substrates.

Annealing studies were performed in-situ for some of the LRP samples and in a commercially available RTA unit for both LRP and MBE samples. Times and temperatures were chosen to study the early stages of misfit dislocation generation.

Misfit dislocation spacings were measured directly using x-ray topography and plan-view transmission electron microscopy. In combination, these techniques have the required sensitivity to study individual misfit dislocations of arbitrary spacing. When average spacings less than 50 μm are mentioned in this report the spacings were determined by TEM; when greater, they are estimated from topographs. The x-ray topographs were taken in transmission using a rotating-anode x-ray generator and a Lang camera with $Cuk_{\alpha 1}$ radiation. The (220) and (400) type substrate reflections were employed. This arrangement enabled misfit dislocations to be studied with epitaxial films as thin as 50 nm. A JEOL 200CX TEM was used to image the dislocations in plan view. Care was taken to analyze the same wafer area with all techniques employed to minimize the effects of spatial variations in alloy composition and thickness. Diffraction imaging techniques were chosen instead of EBIC to avoid ambiguity introduced by possible differences in the electrical activity of the dislocations. (See Kohama, cited above.)

Figure 3:
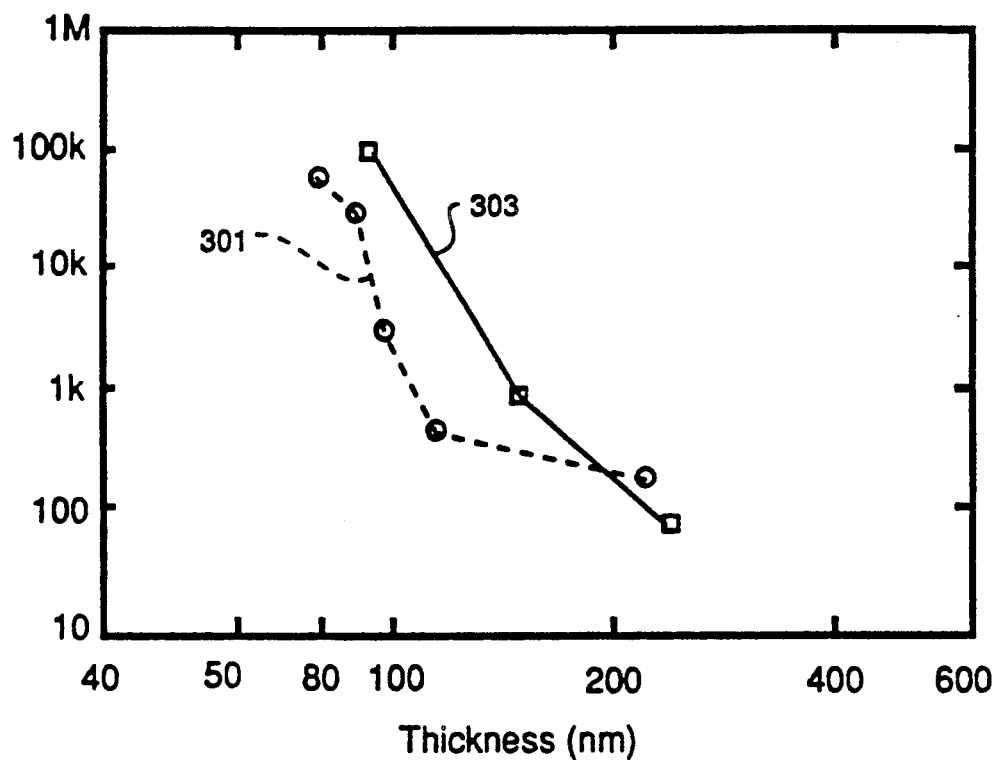
FIG. 3 is a graph of dislocation spacing as a function of thickness in LRP $Si_{0.8}Ge_{0.2}$ films. The circles denote undoped films, the squares denote boron doped films, $[B] = 10^{19} cm^{-3}$.

The results were that uncapped LRP samples were dislocation-free at thicknesses up to 55 nm. Misfit dislocations were observed at a thickness of 60 nm, and the spacing decreased with increasing layer thickness as shown in FIG. 3, which represents dislocation spacings measured after annealing $Si_{1-x}Ge_x$ films, where $x=0.2$. Line 301 denotes undoped films. Line 303 denotes boron doped films, with a dopant concentration of about $10^{19}$ cm$^{-3}$. MBE films had a composition of $x=0.15$. LRP films had a composition of $x=0.21$. Line 501 denotes four minute anneals of 55 nm thick LRP films. Line 503 denotes 1 hour anneals of 41 nm thick LRP films. Line 505 denotes 4 minute anneals of 55 nm thick MBE films. Line 507 denotes 1 hour anneals of 63 nm thick LRP films.

Figure 4:
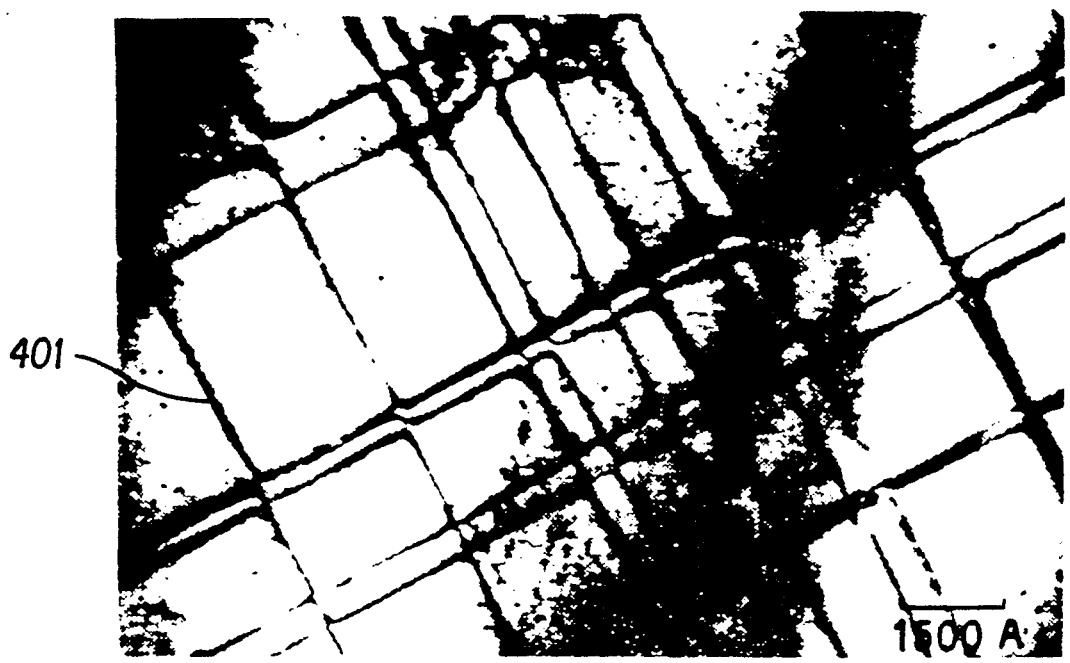
FIG. 4 is a transmission electron micrograph showing Hagen-Strunk dislocation multiplication in a 120 nm thick uncapped $Si_{0.8}Ge_{0.2}$ LRP film.

The dislocation configuration and type consisted of an orthogonal array of dislocations and appeared similar to earlier descriptions of MBE samples. (See Kasper et al. and Kvam et al., cited above.) An example of Hagen-Strunk multiplication, which was evident in samples with numerous dislocation intersections, is illustrated in FIG. 4. (See W. Hagen and H. Strunk, Appl. Phys, 17, 85 (1978).) The majority of the dislocations were straight lengths of misfit dislocations 401 extending to the edge of the specimen. 55 nm thick SiGe samples with approximately 200 nm-thick epitaxial-silicon caps grown at 840° C. had a misfit dislocation spacing of about 6 μm while samples with caps grown at 750° C. had a spacing greater than 20 μm. As will be discussed below, we believe that these defects are introduced during the temperature ramp or early stages of cap growth.

The uncapped 55 nm thick MBE $Si_{0.85}Ge_{0.15}$ layers were also free of misfit dislocations even though they contained threading dislocations with a density of about 40/cm$^2$ which exhibited strong diffraction contrast in the x-ray topographs. Another sample was capped with about 200 nm of silicon at a growth temperature of 520° C. This capped sample was also free of misfit dislocations as-grown.

Figure 5:
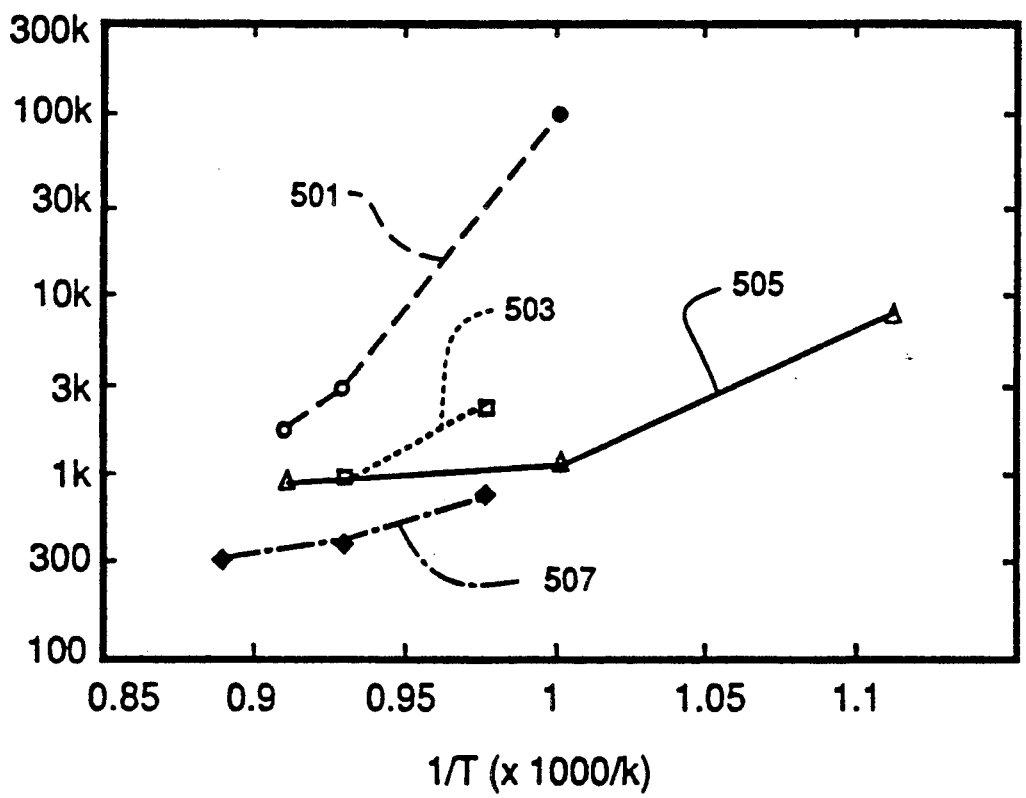
FIG. 5 is a graph showing dislocation spacings measured after annealing $Si_{1-x}Ge_x$ films. MBE films had a composition of $x=0.15$; LRP films, $x=0.21$. "o" denote 4 min. anneals of 55 nm thick LRP films; "□" denote 1 hr. anneals of 41 nm thick LRP films, "Δ" denote 4 min. anneals of 55 nm thick MBE films, and "◇" denote 1 hr. anneals of 63 nm thick LRP films.

The effects of post-growth annealing were that the mean dislocation spacing in uncapped LRP and MBE films decreased as the annealing temperature was increased from 625° C. to 825° C. Data presented in FIG. 5 show the temperature dependence of the mean misfit-dislocation spacing. The LRP samples annealed at 625° C. were free of misfit dislocations while the MBE samples contained misfit dislocations with an average spacing of about 9 μm. The dislocation morphology was the same in annealed and as-grown material for samples with equal dislocation spacing. Islanding was observed for in-situ anneals of LRP samples above about 800° C. LRP films which were annealed in an RTA unit following exposure to air were less likely to island than those annealed in-situ after film growth.

A silicon cap was effective in reducing the rate of misfit-dislocation generation during annealing. Although the capped LRP samples contained misfit dislocations with an average spacing of about 6 μm as-grown, there was no significant increase in the dislocation density after annealing for one hour at temperatures up to 900° C. The capped MBE samples were annealed for four minutes at temperatures up to 1000° C. and remained free of long misfit dislocations of the type observed in uncapped films. However, short dislocations (100–300 μm-long) were present with a density less than 15/cm$^2$ in the MBE samples annealed above 900° C. These dislocations grew from an average length of 100 μm after four minutes at 900° C. to 400 μm after four minutes at 1000° C. The very slow velocity compared to dislocation glide in uncapped samples suggests a different formation mechanism than that for the long misfit dislocations in uncapped films. Some of these dislocations appeared connected to a threading defect at one end. Plan-view TEM confirmed the absence of long misfit dislocations in the sample annealed at 1000° C.

The microstructural observations presented in this work on uncapped films are consistent with the strain-relaxation process described by Kvam [5]. This process involves the expansion and interaction of 60° mixed dislocation half-loops which nucleate at the epilayer surface in order to lower the system energy by relieving misfit strain at the expense of increasing dislocation line length. Quantification of the as-grown misfit-dislocation density in LRP samples formed at 625° C. showed the thickness for the appearance of such defects to be about five times the thickness predicted by equilibrium theory. Literature reports [6] on similar MBE samples grown at 510° C. cite the thickness for the generation of misfit dislocations during growth to be almost the same as that observed in this study. This suggests that growth technique and oxygen content do not dominate the onset of misfit-dislocation generation during growth.

However, differences were observed in the behavior of uncapped LRP and MBE samples on annealing. Despite the six-percent-lower Ge mole fraction in the MBE samples, more rapid misfit-dislocation generation was observed at temperatures up to 825° C. One possible explanation for greater misfit-dislocation generation in the MBE samples is an increase in nucleation rate provided by the higher threading-defect density, although detailed observations have not clearly confirmed this mechanism. Observations of dislocation interactions with precipitates in LRP samples after annealing for sixty hours at 900° C. suggest that oxygen may also be involved. The increase in dislocation-generation rate with temperature in both kinds of material, however, suggests that kinetic limitations dominate the dislocation-generation process.

An important observation was the significant reduction in misfit dislocation generation provided by an epitaxial silicon capping layer. No long misfit dislocation segments were generated in capped MBE films annealed at temperatures up to 1000° C. for four minutes. Capped LRP films which contained dislocations after growth showed no appreciable increase in dislocation density after annealing for one hour at 900° C. The minimum capping-layer thickness for a significant reduction in misfit-dislocation generation was estimated by comparing capped and uncapped films with similar misfit-dislocation densities after annealing. An uncapped sample annealed for 15 sec at 850° C. and a sample with a cap grown at 850° C. for 2.7 minutes had approximately equal dislocation densities. Assuming the dislocations were introduced during the first 15 sec of growth, the minimum cap thickness for a reduction in dislocation generation is estimated to be about 20 nm using the growth rate of SiGe at 850° C. of 1.2 nm/sec.

Equilibrium theory predicts a critical thickness for the growth of a misfit dislocation segment from a threading defect in a single strained $Si_{1-x}Ge_x$ layer on silicon to be about 24 nm with $x=0.15$ and 14 nm with $x=0.21$. (See J. W. Matthews and A. E. Blakeslee, J. Cryst. Growth 27, 181 (1974).) The capped structure discussed above has a stress-free cap that is four times as thick as the strained layer. Additional energy is required to expand a half loop in this structure due to the additional dislocation line length required at the second interface between the strained layer and cap. The equilibrium critical thickness of the capped structure is estimated to be twice as large as that of the uncapped sample; i.e., 48 nm for the $x=0.15$ MBE samples and 28 nm for the $x=0.21$ LRP samples. Therefore, the MBE samples were slightly above, and the LRP samples were almost double, the equilibrium critical thickness. Because no long misfit dislocations were generated during the annealing of either type of sample, kinetic limitations on the nucleation and/or multiplication of misfit dislocations appear to dominate. Because the top surface of the silicon capping layer is stress free, there is no driving force to nucleate a half loop at that surface. It is also unlikely that a dislocation half loop of sufficient radius to relieve stress in the strained layer would spontaneously nucleate during annealing. This reasoning leads us to believe that the mechanism for stress relief in capped films might be different from that likely to operate in uncapped samples.

In conclusion, the growth of a silicon cap on a coherently strained $Si_{1-x}Ge_x$ layer reduces misfit-dislocation generation during annealing at temperatures up to 1000° C. Such films can withstand moderate device processing temperatures without structural degradation. The temperature dependence of misfit-dislocation generation for LRP and MBE films suggests that kinetic limitations dominate in both materials. Differences in the number of misfit dislocations between LRP and MBE samples after annealing were most pronounced at lower temperatures. This observation suggests that additional impediments to dislocation generation in LRP samples or sources of dislocation generation in MBE material may exist.

Other structures than 100 can be manufactured using the present invention. Different process steps and temperatures can be used after the cap is applied. These and other variations upon and modifications to the described embodiments are provided for by the present invention, the scope of which is limited only by the following claim.

What is claimed is:

1. A method comprising:
   obtaining a substrate;
   depositing a thin film of Silicon-Germanium alloy on said substrate so as to define a diode heterojunction therewith;
   capping said thin film with an epitaxial layer of silicon; and
   after said capping, adding and patterning at least one metallization layer using at least one processing step involving heating said thin film to above 600° C.

2. A method as recited in claim 1 wherein said alloy is characterized by the formula $Si_{1-x}Ge_x$, where x is between about 0.15 and 0.21.

3. A method as recited in claim 1 wherein the thickness of said thin film is between about 50 nanometers and about 200 nanometers.

* * * * *